United States Patent
Drumm et al.

(10) Patent No.: US 7,900,182 B2
(45) Date of Patent: *Mar. 1, 2011

(54) METHOD AND SYSTEM FOR DESIGNING AN ELECTRONIC CIRCUIT

(75) Inventors: Anthony DeGroff Drumm, Rochester, MN (US); Lakshmi Narasimha Reddy, Briarcliff Manor, NY (US); Louise Trevillyan, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 232 days.

This patent is subject to a terminal disclaimer.

(21) Appl. No.: 12/255,819

(22) Filed: Oct. 22, 2008

(65) Prior Publication Data

US 2009/0044155 A1    Feb. 12, 2009

Related U.S. Application Data

(63) Continuation of application No. 11/377,432, filed on Mar. 17, 2006, now Pat. No. 7,451,416.

(51) Int. Cl.
*G06F 17/50* (2006.01)
(52) U.S. Cl. .................................. 716/134; 716/124
(58) Field of Classification Search .................. None
See application file for complete search history.

(56) References Cited

U.S. PATENT DOCUMENTS

| | | | |
|---|---|---|---|
| 6,272,668 B1 * | 8/2001 | Teene | 716/10 |
| 6,286,128 B1 | 9/2001 | Pileggi et al. | |
| 6,480,991 B1 | 11/2002 | Cho et al. | |
| 6,557,145 B2 | 4/2003 | Boyle et al. | |
| 6,701,505 B1 | 3/2004 | Srinivasan | |
| 6,904,584 B2 | 6/2005 | Brenner et al. | |
| 7,047,163 B1 | 5/2006 | Chakraborty et al. | |
| 7,178,120 B2 | 2/2007 | Hieter et al. | |

* cited by examiner

*Primary Examiner*—Leigh Marie Garbowski
(74) *Attorney, Agent, or Firm*—Brian P. Verminski, Esq.; McGinn IP Law Group, PLLC

(57) ABSTRACT

A method and system of designing an electronic circuit includes dividing a chip area of a design into a plurality of bins, identifying a candidate bin in the plurality of bins, and performing an area reduction on the candidate bin.

18 Claims, 7 Drawing Sheets

| Table 1 | | | | | | | | |
|---|---|---|---|---|---|---|---|---|
| Network | TBFOM | ZBFOM | WStSlk | T#Neg | Z#Neg | TotWireL | TotArea | CPU |
| Overall | -73488 | -27150 | -8.149 | 250619 | 103854 | 1417543401 | 1622267677 | 196139 |
|  | -73748 | -27481 | -8.211 | 248482 | 105849 | 1417417790 | 1622255860 | 188914 |
|  | 0.4% | 1.2% | 0.8% | -0.9% | 1.9% | -0.0% | -0.0% | -3.8% |

FIG. 6

| Table 2 | | | | | | | | |
|---|---|---|---|---|---|---|---|---|
| Network | TBFOM | ZBFOM | WstSlk | T#Neg | Z#Neg | TotWireL | TotArea | CPU |
| A:area recovery | -135 | 0 | 0.117 | 2034 | 0 | 1157245 | 1063424 | 616 |
| A;baseline | -174 | 0 | 0.115 | 2492 | 0 | 11565246 | 1058164 | 698 |
| | 22.4% | 0.0% | -1.7% | 18.4% | 0.0% | 0.1% | -0.5% | 11.7% |
| B:area recovery | -3672 | -1032 | -0.192 | 32563 | 15856 | 25642156 | 1082524 | 747 |
| B:baseline | -3829 | -1181 | -0.201 | 32075 | 16530 | 25636330 | 1081484 | 711 |
| | 4.1% | 12.6% | 4.5% | -1.5% | 4.1% | -0.0% | -0.1% | -5.0% |
| C:area recovery | -545 | -1 | -0.034 | 2777 | 115 | 2003869 | 1113494 | 965 |
| C:baseline | -622 | -17 | -0.089 | 2671 | 724 | 19842295 | 1109528 | 784 |
| | 12.4% | 94.1% | 61.8% | -4.0% | 84.1% | -1.0% | -0.4% | -23.2% |
| D:area recovery | -18845 | -7586 | -0.894 | 54281 | 24183 | 117844227 | 3879688 | 1720 |
| D:baseline | -18633 | -7533 | -0.894 | 53510 | 23669 | 117844194 | 3879752 | 1666 |
| | -1.1% | -0.7% | 0.0% | -1.4% | -2.2% | -0.0% | 0.0% | -3.2% |
| E:area recovery | -9415 | -2376 | -1.098 | 33049 | 10624 | 122320761 | 35014086 | 727 |
| E:baseline | -9415 | -2376 | -1.098 | 33049 | 10624 | 122320761 | 35014086 | 714 |
| | 0.0% | 0.0% | 0.0% | 0.0% | 0.0% | 0.0% | 0.0% | -1.8% |

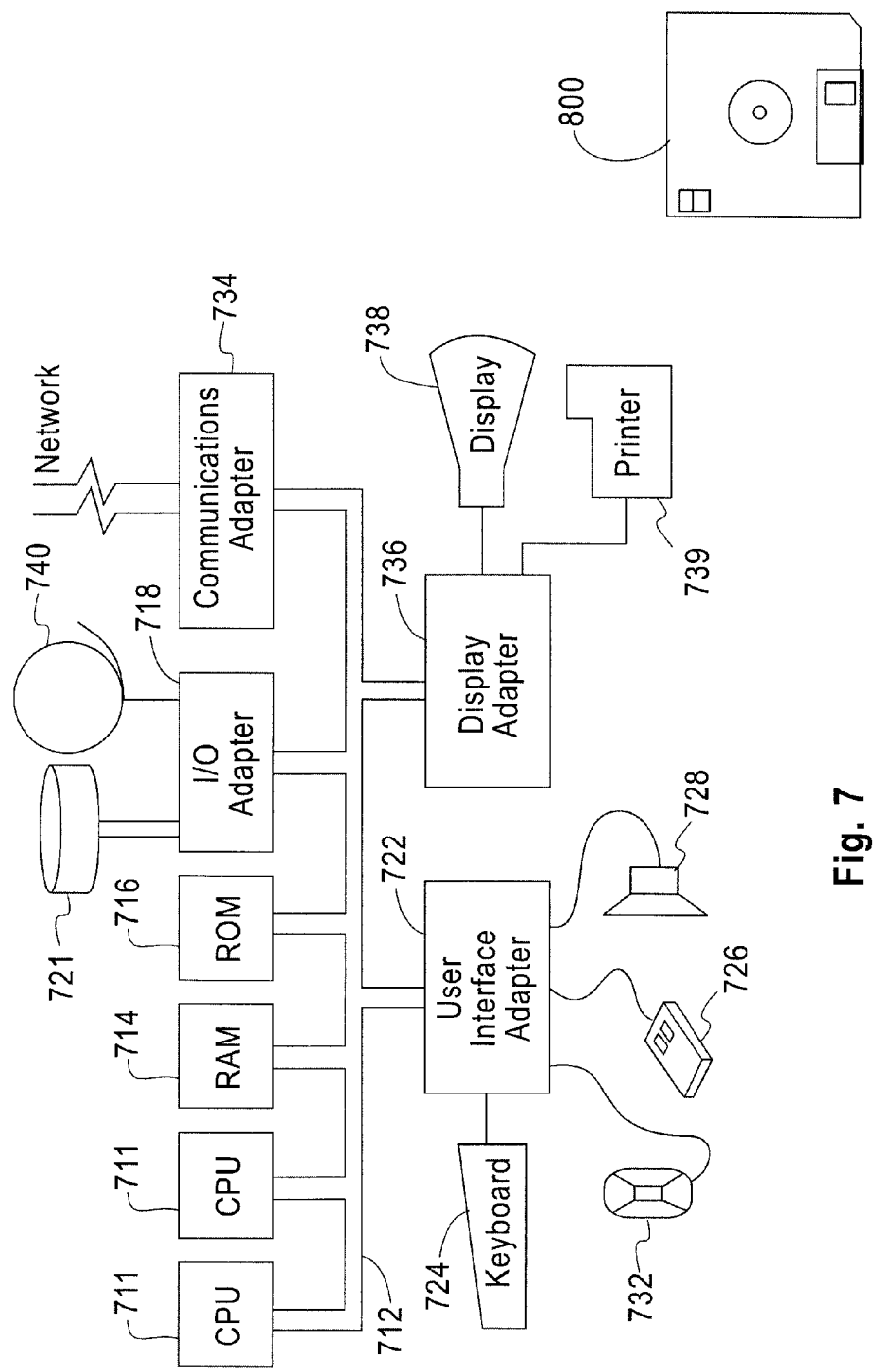

METHOD AND SYSTEM FOR DESIGNING AN ELECTRONIC CIRCUIT

RELATED APPLICATIONS

The present application is a Continuation Application of U.S. patent application Ser. No. 11/377,432 which was filed on Mar. 17, 2006 now U.S. Pat. No. 7,451,416.

BACKGROUND OF THE INVENTION

1. Field of the Invention

The present invention relates to a method and system for designing an electronic circuit an more particularly, to a method and system for designing an electronic circuit which includes identifying candidate bins (e.g., bins which may be placement-congested and timing-critical) and performing an area reduction (e.g., area recovery or area optimization) on the candidate bins.

2. Description of the Related Art

Two important processes within logic and physical synthesis of electronic designs are timing correction, in which paths that do not meet the design's timing criteria are sped up, and area reduction, in which the total space used on the image is reduced.

It is a fact of circuit design that circuit speed can be improved if circuit area is increased, and circuit area can be improved if circuit speed is decreased. In timing-critical portions of the design, optimizations such as resizing and cell decomposition increase area and reduce delay. In non-timing-critical areas (e.g., cells having a positive slack, or slack greater than some predetermined amount (the slack threshold)), the reverse optimizations can be done to reduce area at the cost of delay.

For example, on timing-critical paths, delay can be improved by decomposing a 4-way AND into a tree of 2-way ANDs at the cost of area, while on non-critical timing paths, the tree of 2-way ANDs can be merged into a 4-way AND, reducing area but costing speed.

Even though area reduction has beneficial effects on power and wireability, it is often used lightly if at all in physical synthesis. This is partly because timing is of paramount concern, but another reason is that area reduction can be computationally expensive. On an average design, the non-timing-critical portion of the design is vastly larger than the timing-critical part, so area recovery must work on many more cells than does timing correction and may consequently use a lot of computing time.

In a placed design, every cell is assigned a location on the chip image. The space utilization over the design is not necessarily uniform. That is, there are likely some regions where the cells are tightly packed and there is almost no extra room, and some other regions that are very sparsely used.

In addition, timing-critical and non-timing critical cells are also likely intermixed in physical regions of the chip. That is, non-timing-critical cells may be placed near or adjacent to timing-critical cells. Therefore, timing optimizations, which as noted above, require extra area, may be inhibited by the inability to find placement space for the enlarged portion of the design.

SUMMARY OF THE INVENTION

In view of the foregoing and other exemplary problems, disadvantages, and drawbacks of the aforementioned conventional systems and methods, it is a purpose of the exemplary aspects of the present invention to provide a method and system of designing an electronic circuit which includes area recovery, and which is less time consuming and less expensive than conventional methods and systems.

An exemplary aspect of the present invention includes a method of designing an electronic circuit. The method includes dividing a chip area of a design into a plurality of bins, identifying a candidate bin (e.g., bins which may be placement-congested and timing-critical) in the plurality of bins, and performing an area reduction in which area is recovered from cells in the candidate bin which are other than timing-critical Another exemplary aspect of the present invention includes a system for designing an electronic circuit. The system includes a divider for dividing a chip area of a design into a plurality of bins, an identifying device for identifying a candidate bin in the plurality of bins, and an area reducer for performing an area reduction in which area is recovered from cells in the candidate bin which are other than timing-critical.

Still another exemplary aspect of the present invention includes a design tool for designing an integrated circuit chip. The design tool includes a divider which divides a chip area of a design into a plurality of bins by overlaying a grid on the chip, an identifier for identifying a candidate bin in the plurality of bins, the candidate bin including a bin having a bin density which exceeds a maximum allowable bin density and a bin criticality which exceeds a maximum allowable bin criticality, and an area reducer for performing an area reduction in which area is recovered from cells in the candidate bin which are other than timing-critical.

Another exemplary aspect of the present invention is directed to a programmable storage medium tangibly embodying a program of machine-readable instructions executable by a digital processing apparatus to perform a method of designing an electronic circuit according to the exemplary aspects of the present invention.

BRIEF DESCRIPTION OF THE DRAWINGS

The foregoing and other exemplary purposes, features, aspects and advantages will be better understood from the following detailed description of the exemplary embodiments of the invention with reference to the drawings, in which:

FIG. 6 provides a table including results of applying the method of the present invention to Designs A-E, according to the exemplary aspects of the present invention;

FIG. 7 illustrates a typical hardware configuration which may be used for implementing the inventive method and system for electronic design, according to the exemplary aspects of the present invention; and FIG. 8 illustrates a storage medium 800 for storing instructions for performing a method for electronic design, according to the exemplary aspects of the present invention.

DETAILED DESCRIPTION OF THE EXEMPLARY EMBODIMENTS OF THE INVENTION

Figure 1:
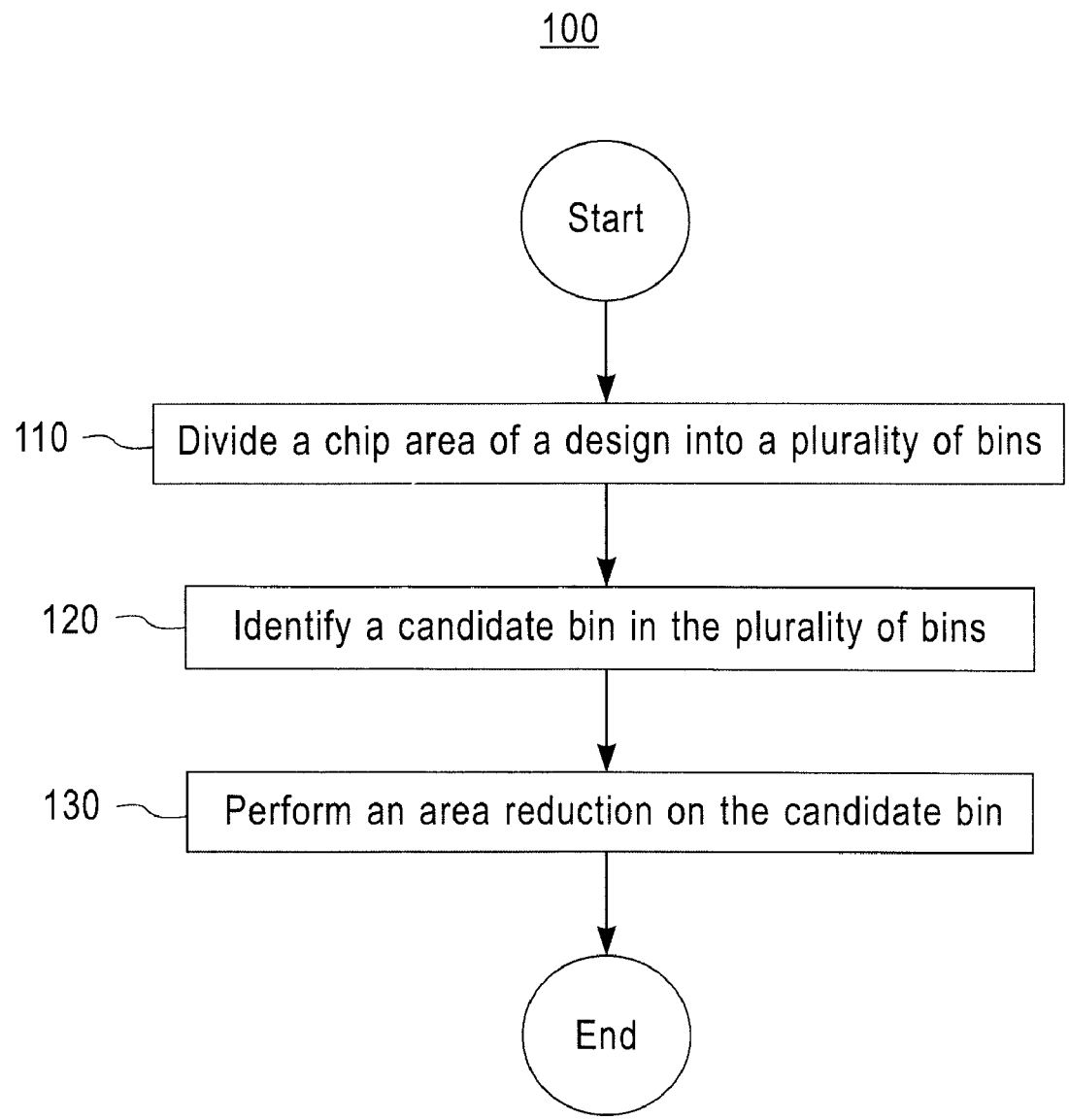
FIG. 1 illustrates a method 100 of designing an electronic circuit, according to the exemplary aspects of the present invention.
Figure 2:
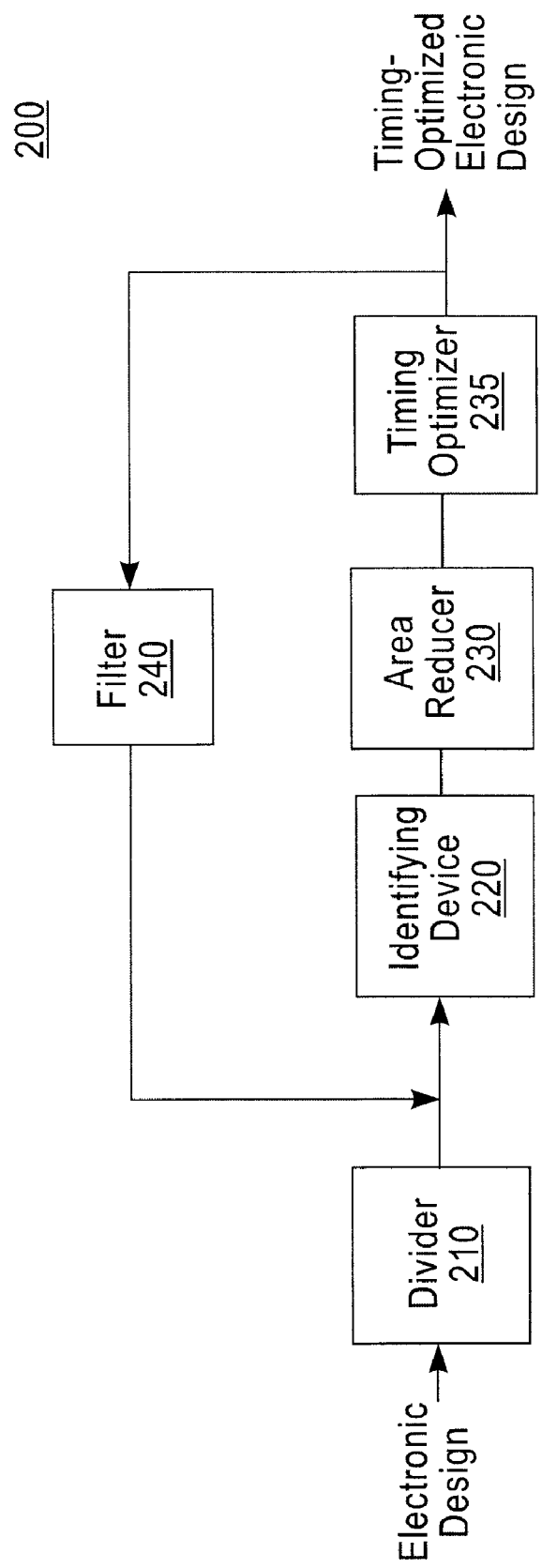
FIG. 2 illustrates a system 200 for designing an electronic circuit, according to the exemplary aspects of the present invention.

Referring now to the drawings, FIGS. 1-8 illustrate the exemplary aspects of the present invention.

Specifically, as illustrated in FIG. 1, an exemplary aspect of the present invention includes a method 100 of designing an electronic circuit which includes dividing (110) a chip area of a design into a plurality of bins, identifying (120) a candidate bin (e.g., at least one candidate bin) in the plurality of bins, and performing (130) an area reduction in which area is recovered from cells in the candidate bin (e.g., at least one candidate bin) which are other than timing-critical. In an exemplary aspect of the present invention, area reduction may performed on a candidate bin and after area is recovered, the timing optimization may take over and work on critical (e.g., bad slack) cells or nets in the design.

Overview

In a placed design, the term "area reduction" (e.g., or "area recovery") may refer to the process of improving (e.g., optimizing) the design to reduce the area taken by (e.g., occupied by) the cells of the design. That is, "area recovery" may mean reducing the used area (e.g., the sum of the cell areas in a region) of the design.

Generally, in electronic circuit design (e.g., placement design), there is a tradeoff between area and time. Faster processing usually requires a larger area. Although it is expensive, reducing an area (e.g., a cell area) on a chip is generally desirable. Specifically, reducing an area in targeted physical regions of the design is helpful to allow timing optimizations to apply.

The present invention recognizes a benefit of targeting non-critical cells in a congested region (e.g., a physical area of the design in which the available area is highly utilized). The term "non-critical cell" may be defined, for example, as a cell that does not have a negative slack.

Specifically, the present invention may reduce the computational expense by determining regions where area reduction would produce benefits, making appropriate slack v. area tradeoffs by adjusting the "slack threshold", and filtering the regions and cells. The term "slack threshold" may refer to a margin for slack, and may for example, be specified by the user of the synthesis tool. The slack threshold is usually zero (0) or greater. Any slack less than this amount is considered to be critical.

The "slack" at a point in an integrated circuit (e.g., the slack at a circuit element input pin) may refer to the amount by which a signal arrives at that point earlier than is required for a correct circuit operation. Thus, a negative slack indicates that a signal arrives too late, and a slack of zero (0) means that the point exactly meets its timing. It is often the case that some margin is needed, so a number other than zero (0) is specified as the timing target (e.g., the "slack threshold").

The "slack" of a cell may refer to the worst slack at any connection on the cell. For example, for a NAND device, the slack may refer to the minimum slack at the NAND input and output connections. It should be noted that for all cells without memory, (e.g. NAND, NOR, XOR, etc.) the worst slack at some input may equal (e.g., may always equal) the worst slack at the output, so one can refer uniquely to the worst slack at such a cell and capture both the input and output behavior.

To determine the regions where area reduction would produce benefits, the present invention may define a grid over the image of a design (e.g., the chip, the circuit, etc.) to form "bins" (e.g., regions of a chip). The present invention may compute (e.g., for each bin) a normalized criticality score that reflects the urgency of correcting timing and the magnitude of timing problem.

In addition, the present invention may compute (e.g., for each bin) a utilization ratio. Thus, the present invention may apply area reduction (e.g., optimizations) in the bins which exceed thresholds in criticality and utilization.

An important aspect of the present invention includes a slack threshold adjustment. For example, a user may specify a slack threshold (e.g., an original slack goal), which the placement-driven synthesis (PDS) will attempt to reach. A typical application specific integrated circuit (ASIC) value of slack threshold is 300 ps.

The present invention may adjust the slack threshold in an effort to optimize the timing of the circuit. That is, the present invention may trade off slack at the threshold end of the slack range to get improvements in the worst slacks.

For example, the invention may compute a temporary threshold for area reduction to be the best slack in the critical optimization region plus some separation. For example, if timing optimization is working on a set of cells with a slack range of [−1.000, −0.500], and a 50 ps separation is desired, all cells with slack of −0.450 ps or greater may be candidates for area reduction.

The present invention may also filter for run-time performance. That is, since area reduction (e.g., area recovery) can be time consuming and expensive, it is desirable to apply area reduction when beneficial (e.g., only when it is needed for timing optimization). For example, to filter bins, the present invention may retain data (e.g., slack, area utilization, total capacitance driven, etc.) and not revisit the bin unless the values of this data have changed To filter cells, the present invention may retain data and not revisit the cell unless the data have changed.

For example, in the present invention, a bin (e.g., or a cell within a bin) may be skipped if signature data have not changed since the last attempt. If the bin is visited, the present invention may not attempt to change a cell within the bin if its signature data have not changed since the last attempt.

Referring again to the drawings, the exemplary aspects of the present invention may include a system 200 for designing an electronic circuit (e.g., reducing placement congestion to improve timing). The system 200 includes a divider 210 for dividing a chip area of a design into a plurality of bins, an identifying device 220 for identifying a candidate bin in the plurality of bins, and an area reducer 230 for performing an area reduction on the candidate bin.

The system 200 may also include a timing optimizer 235, a memory device (e.g., RAM, ROM, etc.) (not shown) for storing data including data output from the area reducer 230 (e.g., and/or data output from the timing optimizer 235), and a filter 240 for filtering the plurality of bins such that a determination of whether to perform timing optimization on a bin is based on an amount of change in the data for the bin generated by a previous timing optimization. In an exemplary aspect of the present invention, the area reducer 230 may perform area reduction on the candidate bin and after area is recovered, timing optimization (e.g., using timing optimizer 235) may take over and work on critical (e.g., bad slack) cells or nets in the design.

The effectiveness of the present invention has been shown by the inventors. Specifically, as discussed in greater detail below with reference to FIG. 5, the inventors have conducted tests in which eighteen (18) designs were run, eight (8) being very sparse, and two (2) being very full and requiring full area recovery. Eight of the designs had some area of congestion but overall lower utilization.

Overall, when the method and system according to the exemplary aspects of the present invention were applied to the circuit, there was an improvement in the designs. The eight (8) sparse designs did not change, which was expected, since no bins exceeded utilization. The two (2) very full bins did not change which was also expected, since the area reduction was already being applied throughout. However, of the remaining designs, seven (7) improved whereas only one (1) got worse which may be attributed to interactions with optimizations.

Detailed Discussion

The present invention recognizes the importance of area reduction for timing optimization. That is, the present invention recognizes that if congestion can be reduced in placement "hot spots", room can be provided for timing optimizations to apply.

The exemplary aspects of the present invention provide a method of efficiently (e.g., automatically) identifying placement-congested and timing-critical physical regions in a placed-electronic design. These are the regions where a design automation tool would focus timing optimization. Because timing optimization usually sacrifices area, it is advantageous to identify these regions and apply area-recovery techniques within the regions prior to and intermixed with timing optimization.

Applying such area recovery techniques to an entire design would be computationally expensive. Using the present invention, on the other hand, a designer may avoid such a large expense while still providing the space needed for optimization.

The present invention includes a method of efficiently targeting physically placement-congested regions of the design for area recovery. Important ideas of the present invention include (but are not limited to): (1) identification of the placement-congested physical regions to be targeted, (2) filtering the regions and the cells within the regions to avoid needless recomputation where optimization has previously failed, and (3) adjustment of timing targets to allow area recovery even on timing-critical cells (e.g., cells having negative slack, or slack less than some predetermined amount (e.g., the slack threshold).

Even designs that have design-level low density and do not benefit much from overall area recovery can have regions of placement congestion. Therefore, such designs can also benefit from the present invention.

A purpose of the exemplary aspects of the present invention includes providing a mechanism for predicting regions on the chip where space will be needed to carry out timing optimization and to target these regions for area reduction. In regions that are sparsely used or where there are few or no timing-critical cells, area reduction may not be helpful (e.g., necessary) for purposes of timing optimization.

This method may also work in concert with an optimization strategy (e.g., such as that used in IBM's PDS (Placement-Driven synthesis)). For example, the regions identified by this method may be used in a "driver" that will target the identified regions for area reduction. The "driver" may include, for example, a program that selects cells for timing optimization or area recovery. The driver may pass these cells to a transformer (e.g., transformations) which will analyze and perform the actual optimizations.

Two quantities, the bin density and the criticality score, may be computed. These quantities reflect the placement congestion in a region and how important this congestion is for timing. When both the bin density and criticality score are high, the region may be a candidate for area reduction.

An advantage of the exemplary aspects of the present invention, is that the invention may target specific regions for area reduction where space will be needed for optimization, but does not necessarily expend compute power to reduce area in sparsely occupied or non-critical regions of the design. That is, the present invention may add space (e.g., increase a cell area) where it is needed without necessarily incurring the overhead of analyzing the total space of non-critical portions of the design.

Dividing the Chip Area

Figures 3, 5:
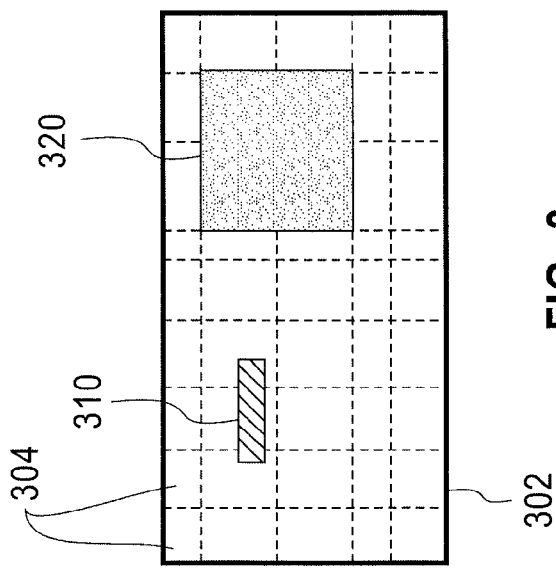
FIG. 3 illustrates a chip area 302 of a design which has been "divided" into bins 304, according to the exemplary aspects of the present invention.
FIG. 5 provides a table including results of applying the method of the present invention to eighteen (18) designs, according to the exemplary aspects of the present invention.

The area of an image (e.g., a chip) may be divided into "bins" by overlaying a grid on the design. FIG. 3 illustrates such a grid for dividing a chip area of a design into "bins". The outer heavy black lines in FIG. 3 illustrate the outline of the chip area 302 of a design, and the dashed lines show the chip area 302 divided into bins.

The grid may be regular, so that each bin has the same area, or it may be irregular, as illustrated in FIG. 3, so that bins are not of uniform size. Non-uniformity may be useful in cases where there are large objects, such as arrays or other intellectual property (IP) blocks, in the design. That is, the bins may be configured irregularly to accommodate the outline of a large, fixed object.

FIG. 3 illustrates, for example, an image (e.g., chip area 302) divided into irregular (e.g., irregular-shaped) bins 304 overlaid on a design space (e.g., a chip), with a cell 310 straddling a bin and a large fixed object 320 in the design.

The number and size of the bins may be dependent on the available area (e.g., the space available in a region of the design). Further, the number of bins may increase (e.g., and the bin size may decrease) as the optimization process progresses.

Compute the Bin Densities

In the bins (e.g., for each bin), evaluate a bin's congestion by dividing the sum of the cell areas within the bin by the total area available within the bin. This gives the density of the bin. The bin density should never be above 1.00.

If a cell straddles one or more bins as illustrated by the cell 310 (e.g., cross-hatched area) in FIG. 3, the cell may be considered to be in the bin where the majority of its area lies. Further, the available area in that bin may be increased, and the used and available areas in the other bins where the cell occupies space may be decreased. The effect of this is to move the area (e.g., all of the area) taken by the cell to the majority bin and subtract it from the non-majority bins.

Computing the Bin Criticality

The timing criticality for the bins (e.g., for each bin) may be evaluated by computing the worst slack in the bin and also the ratio of the area taken by critical cells to the area available within the bin, according to the following equation:

$$\text{critical area ratio(bin)} = \text{SUM(areas of critical cells)} / \text{total bin area}$$

The critical area ratio reflects how much area might be affected by timing optimization and quantifies the magnitude of the possible area recovery needs in the bin.

Further, a slack score for the bins may be computed as follows:

$$\text{slack score(bin)} = \max((\text{slack threshold} - \text{worst slack in bin}), 0).$$

The slack score may reflect the urgency of the timing problem. If the worst slack in the bin is above the threshold, the slack score is 0 as there is no timing problem in the bin. If there are critical slacks in the bin, the slack score will be higher for bins with worse slacks.

To compute an overall need for optimization that may be required in the bin, the invention may multiply the slack score and the critical area ratio for the bin, as follows:

bin-criticality(bin)=critical area ratio(bin)×slack score (bin)

The bin-criticality of a bin may quantify how important it is to do area reduction (e.g., area recovery) in the bin. The bin-criticality may be low for bins with low area-recovery need, where the area of critical cells in the bin is low and the bin's slacks are relatively good, and it will be highest in bins that need the most attention, where the bins contain the most-critical slacks and a high proportion of area taken by critical cells.

Normalizing the Bin Criticalities

The invention may divide the range between the lowest and highest bin criticality by N intervals (e.g., regular intervals), as follows:

criticality interval=(largest bin criticality−smallest bin criticality)/N.

The invention may compute the position of the bins in this distribution using the following formula:

criticality score(bin)=(bin−criticality(bin)−smallest bin criticality)/criticality interval.

The bin considered most critical may have a score of N, and the least critical bin may have a score of zero. For convenience in scaling to density, N may be chosen as 100 and the criticalities may be scaled in the range 0 to 1. A purpose of forming the distribution, for example, may be to provide a design-independent measure of bin criticality.

The maximum density and criticality allowed may be specified (e.g., input by a user) to a driver. For example, a bin of interest having a bin density over 0.80 and a criticality score over 0.70 may be considered for area reduction (e.g., a candidate bin). It is possible to do strict area reduction on congested regions by setting the criticality specification to 0.0.

The driver may traverse the bins, selecting those that meet the specified criteria (e.g., exceeding the maximum bin density and bin criticality score), and pass the non-critical cells (e.g., all of the non-critical cells) in the candidate bins to the area reducer for area reduction. Possible methods of area reduction (e.g., area recovery or area optimization) may include, for example, resizing a cell (e.g., reducing a cell area), recomposition of a group of cells into a smaller configuration with similar function (e.g., merging trees, forming two-level boxes, using complements, etc.), and/or moving cells out of the bin.

The driver may also be run periodically as optimization progresses. That is, additional timing optimization may be performed after an initial area recovery and timing optimization is performed. That is the exemplary aspects of the present invention may include an iterative process which may allow additional area recovery and timing optimization. These iterations may be terminated (e.g., a synthesis run stopped), for example, when the timing optimization goal (e.g., no slack) is reached, in which case the final design having a reduced placement congestion may be output to the user.

In order to conserve compute time, "filtering" may also be used. That is, information about the bins and/or the cells may be retained and the driver may not select the bin or a cell within the bin if the bin characteristics and/or cell characteristics have not changed (e.g., or changed by no more than a negligible amount) since the last time area recovery was called. These characteristics may include, for example, area and timing criteria.

For example, during a synthesis run, a user might specify a slack threshold to be used as an optimization goal. For example, the threshold might be 200 ps, which would cause optimizations to try to make the final design time with no slack less than 200 ps. However, it is more important for a design to correct slacks, at the low end of the slack range rather than at the end near this threshold.

For example, if the worst slack is −1000 ps, it is desirable to increase this slack even if it means making a point near the 200 threshold to become worse. Thus, it can be beneficial to do area recovery below the user-specific slack threshold, giving up delay to gain area to fix the most negative slacks.

During optimization, the invention may define a set of active critical cells (e.g., the cells that form the part of the critical portion of the design currently being worked on by the optimization process) in which optimization is being done. This set is defined by a slack range with the lowest slack in the range being the worst slack in the design, and the highest slack being defined by the synthesis process, usually by a number of paths or points to be optimized. The highest slack will always be greater than or equal to the lowest slack.

During area recovery, the invention can use the highest slack in the set of active critical cells as a temporary slack threshold, so that area reduction (e.g., area recovery) will proceed on boxes that have slacks well below the user's specification. For example, while the user slack threshold is 200 ps, the range of the active critical cell set could be −1000 to −850 ps. In this case, area reduction (e.g., area recovery) could be done on any portion of the design in which the slack is greater than −850 ps.

It may also be desirable to enforce some separation between the highest slack in the active critical cell set and the point at which area reduction (e.g., area recovery) will start. This can be done by specifying a minimum separation to the method. For example, where the range of the active critical cell set is −1000 to −850 ps, if the minimum separation is 50 ps, then area reduction (e.g., area recovery) may apply only to regions (e.g., bins) in which the slack is greater than −800 ps.

Figure 4A:
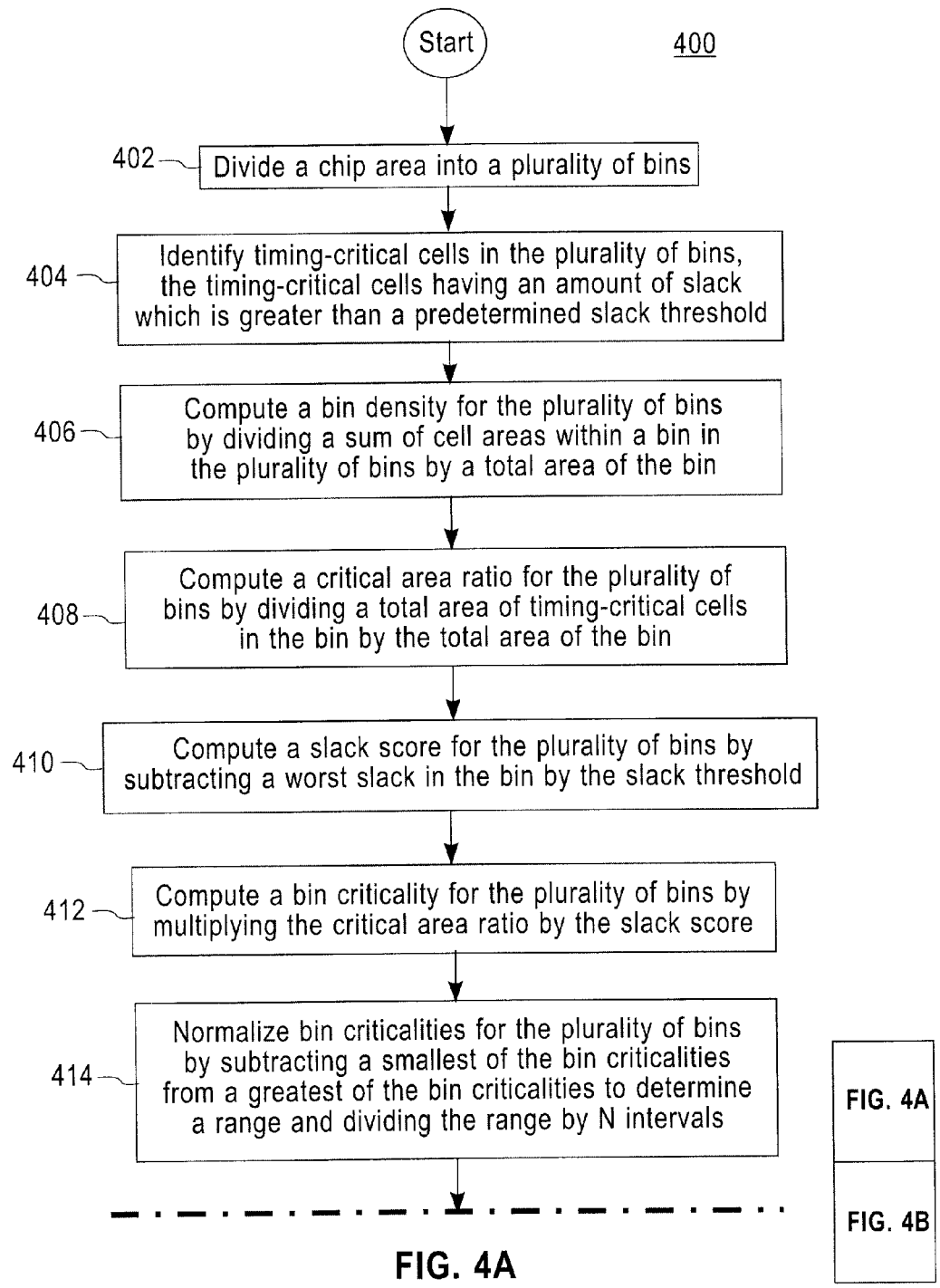
FIG. 4 provides a flowchart illustrating a method 400, according to the exemplary aspects of the present invention.
Figure 4B:
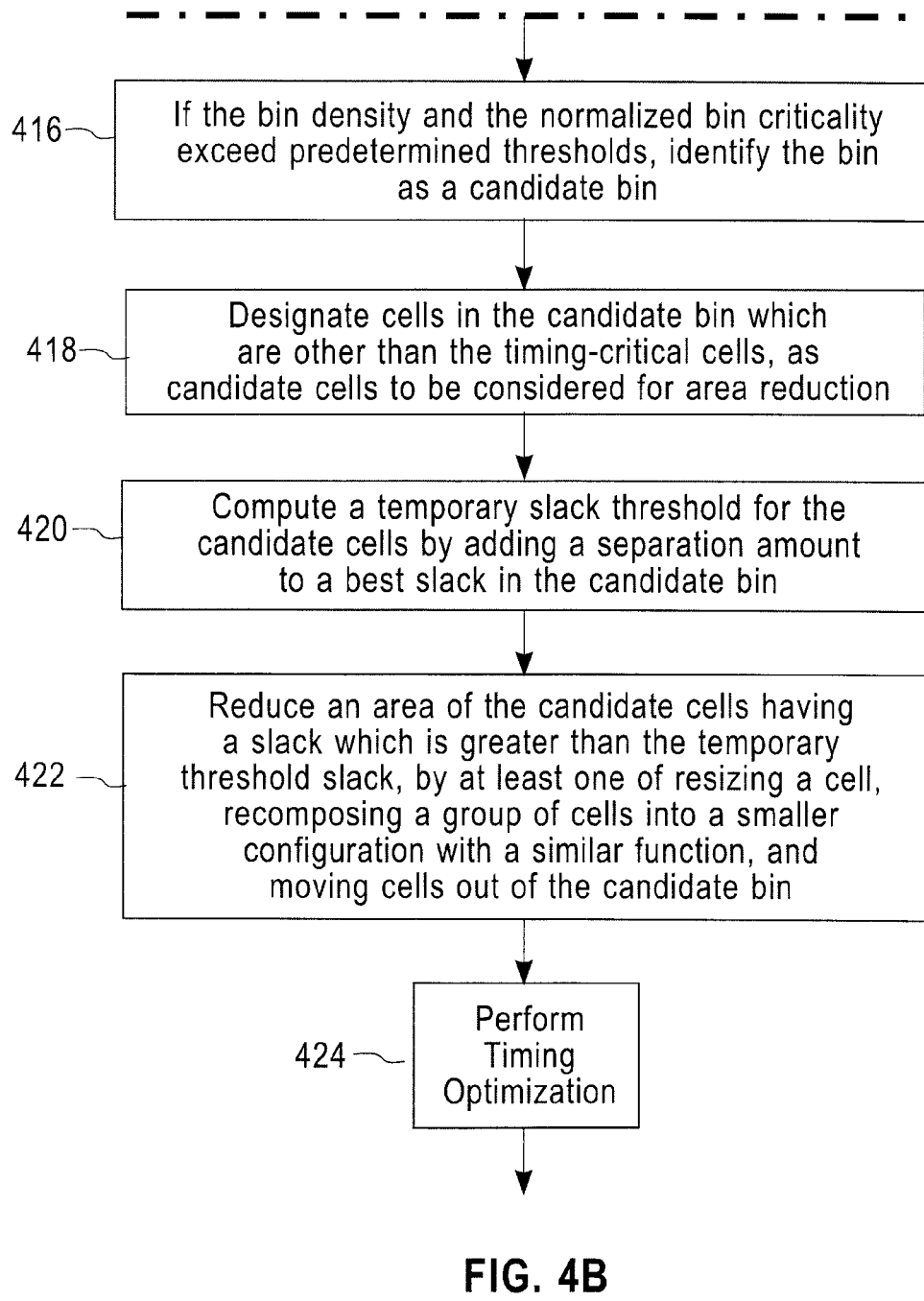

Referring again to the drawings, FIG. 4 provides a detailed flowchart illustrating a method 400 according to an exemplary aspect of the present invention. As illustrated in FIG. 4, the method 400 includes dividing (402) a chip area of a design into a plurality of bins.

The method 400 also includes an identifying module which includes identifying (404) timing-critical cells in the plurality of bins, the timing-critical cells having an amount of slack which is greater than a predetermined slack threshold, computing (406) a bin density for the plurality of bins by dividing a sum of cell areas within a bin in the plurality of bins by a total area of the bin, computing (408) a critical area ratio for the plurality of bins by dividing a total area of timing-critical cells in the bin by the total area of the bin, computing (410) a slack score for the plurality of bins by subtracting a worst slack in the bin by the slack threshold, computing (412) a bin criticality for the plurality of bins by multiplying the critical area ratio by the slack score, normalizing (414) bin criticalities for the plurality of bins by subtracting a smallest of the bin criticalities from a greatest of the bin criticalities to determine a range and dividing the range by N intervals, and if the bin density and the normalized bin criticality exceed predetermined thresholds, identifying (416) the bin as a candidate bin.

The method 400 also includes an area reduction module which includes designating cells (418) in the candidate bin which are other than the timing-critical cells, as candidate cells to be considered for area reduction, computing (420) a temporary slack threshold for the candidate cells by adding a separation amount to a best slack in the candidate bin, and reducing (422) an area of the candidate cells having a slack which is greater than the temporary threshold slack, such as by at least one of resizing a cell, recomposing a group of cells into a smaller configuration with a similar function, and moving cells out of the candidate bin.

The method 400 may also include, after area is recovered, performing (424) a timing optimization on critical (e.g., bad slack) cells or nets in the design. The method 400 may also include an iterative process which may further refine the timing optimization. For example, the method 400 (e.g., continuing a synthesis run) may filter the plurality of bins (e.g., including filtering the cells within the bins) such that a determination of whether to perform area reduction on a bin during a next iteration is based on an amount of change in the data for the bin generated by a previous iteration (e.g., a previous timing optimization).

It should be noted that the exemplary aspects of the present invention (e.g., as with conventional optimization systems) may run on an "in core" model of the design. That is, when a change is made to the design (such as by timing optimization or area reduction), the change may be reflected (e.g., immediately reflected) in the model and anything else in the current run looking at the model (e.g. timing) will see the change.

These "in core" models contain "objects" such as cells, wires, pins, etc., which can have "properties" attached to them. The name of a cell and its function are examples of such properties. The "bins" in the present invention may be considered "objects", and the various metrics computed for the bins can be thought of as properties of the bins. The signatures for filtering cells are also properties of the cells.

Thus, in the exemplary aspects of the present invention, the area reduction (e.g., area optimizations) may be inserted periodically into a script among the timing optimizations. In this case, an exemplary aspect of the present invention may proceed, for example, as follows: Timing optimizations 1 and 2; Area optimization, including binning, filtering and cell signatures; Timing optimization 3; Area optimization, including binning, filtering and cell signatures; Timing optimizations 4, 5 and 6; etc. At the end of the process, the final results may be stored (e.g., written to disk).

Testing

The inventors conducted tests in which an exemplary aspect of present invention was embedded in IBM's Physical Synthesis Electronic Design Automation tool (PDS). The results are provided in Tables 1 and 2 of FIGS. 5 and 6, respectively.

In Tables 1 and 2, the first line gives the results for the method according the exemplary aspects of the present invention, the second line gives baseline results, and the third line of each group shows the percentage change for that column. Positive percentages indicate improvement. Percentages are included to show the direction (improvement or not) of the results.

Specifically, FIG. 5 provides Table 1 which illustrates the overall results of the tests of the present invention which were conducted by the inventors, and in which the method was applied to eighteen (18) designs, of which eight (8) were very sparse, and two (2) were very full and required full area recovery. Due to its expense, area recovery is not normally used on these ten (10) designs. The remaining eight (8) designs had some areas of congestion but had an overall lower utilization. The bin-density threshold was set to 0.8 and the slack-score threshold was set to 0.65.

As illustrated in FIG. 5, the use of the present invention resulted in an improvement of the designs. Specifically, of the eighteen (18) designs, the eight (8) designs which were very sparse did not change (as was expected since these designs had no bins which exceeded utilization), and the two (2) very full designs did not change (as was expected since area reduction was already being applied throughout). That is, in these cases, the present invention recognized that area recovery would not help. Further, the eight (8) remaining designs did change, seven (7) of the designs improving (e.g., some improved by more than 10% in key metrics), and one (1) of the designs getting slightly worse (less than 2%).

That is, there is a general improvement in the overall timing results, with little or no change to wire length or area, and a modest (3.8%) increase in CPU time. This is exactly what is expected, as little change would be expected in eight (8) of the ten (10) designs (the ones in which area reduction was already in use or in which there is no placement congestion). The threshold-based number of negatives has gotten worse due to the slack adjustment (e.g., automatic slack adjustment).

Specifically, as illustrated in FIG. 5, the lower slack range (ZB and Z# and wstslk) improved at the expense of the threshold numbers (TB, T#) as a result of threshold adjustment, and the increase in central processing unit (CPU) time was modest (e.g., there was only a slight decrease in speed).

The information included in the columns of Tables 1 and 2 in FIGS. 5 and 6, respectively, may be described as follows:

column 1—Network—an identification of the design being run or the type of results column 2—TBFOM—Threshold-based figure of Merit. A measure of the total timing st1atus of the design based on the user-specific slack threshold, Larger is better.

column 3—ZBFOM—Zero-based figure of merit. A measure of the total timing status of the design based on zero slack. Larger is better.

column 4—WstSIk—the worst slack in the design. Larger is better.

column 5—T#Neg—Threshold-based number of negatives. The number of timing endpoints with slacks below the user-specified slack threshold. Smaller is better.

column 6—Z#Net—Zero-based number of negatives. The number of timing endpoints with slacks below zero. Smaller is better.

column 7—TotWireL—the sum of the lengths of all the wires in the design. Smaller is better.

column 8—TotArea—the total used area of the design. Smaller is better.

column 9—CPU—the CPU time taken for the entire optimization process. Smaller is better.

FIG. 6 provides Table 2 which includes the results from applying the method according to the exemplary aspects of the present invention on selected designs A-E. Specifically, Table 2 illustrates some details on various types of designs and shows how the present invention works on designs with differing congestion characteristics.

For example, in Table 2, for design A, the worst slack has become worse by 1.7%, but the actual change is only 2 picoseconds, which is not significant.

Design A has high overall density and cannot be successfully run through PDS without area reduction. This shows generally better or equal timing results when compared with previous area recovery methods, and a better CPU time because area is no longer being reduced in regions where it will not be used for optimization. The total area is higher because of this.

Designs B, C and D do not have high overall placement densities, but have some congested regions. Design B and C both have much better timing results with negligible effects on area and wire length. The T#Neg may be worse due to the automatic slack threshold adjustment described above.

Slacks outside the range of the set of active critical cells have been sacrificed so improve lower slacks, so the worst slack and zero-based FOM and number of negatives have improved.

On design D, there are not many congested areas. The method was applied 60 times during the run, and never took more than 10 seconds of CPU time per application. It made changes only 19 times, and reduced area by only 120 cells (out of 35 million). At most 3 bins met the bin-density and criticality-score threshold for the method.

The reason the design characteristics worsened even in the face of such small changes has to do with the interaction of the current method with the other optimizations. They do not always use extra space wisely and small changes can cause significantly different "optimization paths".

In all three of these designs, the extra CPU time is only partly caused by applying area recovery where it was not applied in the baseline. The rest of the increase in CPU time is due to the timing optimizations applying more often or differently than they did in the baseline score. Design E has very few congested regions. Area reduction has no effect on this design, as expected.

Referring now to FIG. 7, system 700 illustrates a typical hardware configuration which may be used for implementing the inventive method and system for electronic design, according to the exemplary aspects of the present invention. The configuration has preferably at least one processor or central processing unit (CPU) 711. The CPUs 711 are interconnected via a system bus 712 to a random access memory (RAM) 714, read-only memory (ROM) 716, input/output (I/O) adapter 718 (for connecting peripheral devices such as disk units 721 and tape drives 740 to the bus 712), user interface adapter 722 (for connecting a keyboard 724, mouse 726, speaker 728, microphone 732, and/or other user interface device to the bus 712), a communication adapter 734 for connecting an information handling system to a data processing network, the Internet, and Intranet, a personal area network (PAN), etc., and a display adapter 736 for connecting the bus 712 to a display device 738 and/or printer 739. Further, an automated reader/scanner 741 may be included. Such readers/scanners are commercially available from many sources.

In addition to the system described above, a different aspect of the invention includes a computer-implemented method for performing the above method. As an example, this method may be implemented in the particular environment discussed above.

Such a method may be implemented, for example, by operating a computer, as embodied by a digital data processing apparatus, to execute a sequence of machine-readable instructions. These instructions may reside in various types of signal-bearing media.

Thus, this aspect of the present invention is directed to a programmed product, including signal-bearing media tangibly embodying a program of machine-readable instructions executable by a digital data processor to perform the above method.

Such a method may be implemented, for example, by operating the CPU 711 to execute a sequence of machine-readable instructions. These instructions may reside in various types of signal bearing media.

Thus, this aspect of the present invention is directed to a programmed product, comprising signal-bearing media tangibly embodying a program of machine-readable instructions executable by a digital data processor incorporating the CPU 711 and hardware above, to perform the method of the invention.

This signal-bearing media may include, for example, a RAM contained within the CPU 711, as represented by the fast-access storage for example. Alternatively, the instructions may be contained in another signal-bearing media, such as a magnetic data storage diskette 800 (FIG. 8), directly or indirectly accessible by the CPU 711.

Whether contained in the computer server/CPU 711, or elsewhere, the instructions may be stored on a variety of machine-readable data storage media, such as DASD storage (e.g, a conventional "hard drive" or a RAID array), magnetic tape, electronic read-only memory (e.g., ROM, EPROM, or EEPROM), an optical storage device (e.g., CD-ROM, WORM, DVD, digital optical tape, etc.), paper "punch" cards, or other suitable signal-bearing media including transmission media such as digital and analog and communication links and wireless. In an illustrative embodiment of the invention, the machine-readable instructions may comprise software object code, complied from a language such as "C," etc.

The unique and novel features of the present invention allow the present invention to provide a method and system of designing an electronic circuit including timing optimization which is less time consuming and less expensive than conventional methods and systems.

While the invention has been described in terms of one or more exemplary embodiments, those skilled in the art will recognize that the invention can be practiced with modification within the spirit and scope of the appended claims. Specifically, one of ordinary skill in the art will understand that the drawings herein are meant to be illustrative, and the design of the inventive assembly is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

The invention claimed is:

1. A method of designing an electronic circuit, comprising:
dividing a chip area of a design into a plurality of bins;
identifying a candidate bin in said plurality of bins; and
performing an area reduction on said candidate bin,
wherein said area reduction is performed by an area reducer which comprises:
a designating device for designating said cells in said candidate bin which are other than timing-critical, as candidate cells to be considered for area reduction; and
a computing device for computing a temporary slack threshold for said candidate cells by adding a separation amount to a best slack in said candidate bin,
wherein said area reducer reduces an area of said candidate cells having a slack which is greater than said temporary slack threshold.

2. The method of claim 1, wherein said identifying said candidate bin comprises identifying a bin having a predetermined bin criticality.

3. The method of claim 2, wherein said identifying said candidate bin comprises identifying a bin having a predetermined utilization ratio comprising a ratio of total used area of said bin to a total area of said bin.

4. The method of claim 3, wherein said candidate bin comprises a bin in said plurality of bins having said predetermined bin criticality and said predetermined utilization ratio.

5. The method of claim 1, further comprising:
performing a timing optimization on said design.

6. The method of claim 5, further comprising:
   storing data generated by at least one of said area reduction and said timing optimization.

7. The method of claim 6, wherein said data comprises a cell slack in a bin, an area utilization ratio for said bin, and a total capacitance driven, and
   wherein said cell slack comprises an amount by which a signal arrives at a point earlier than is required for correct circuit operation.

8. The method of claim 6, further comprising:
   filtering bins in said plurality of bins such that a determination of whether to perform a next timing optimization on said bin is based on an amount of change in said data for said bin which is generated by a previous timing optimization.

9. The method of claim 1, wherein said identifying said candidate bins comprises:
   identifying timing-critical cells in said plurality of bins, said timing-critical cells having an amount of slack which is greater than a predetermined slack threshold.

10. The method of claim 9, wherein said identifying said candidate bins further comprises:
    computing a bin density for said plurality of bins by dividing a sum of cell areas within a bin in said plurality of bins by a total area of said bin.

11. The method of claim 10, wherein said identifying said candidate bins further comprises:
    computing a critical area ratio for said plurality of bins by dividing a total area of timing-critical cells in said bin by said total area of said bin.

12. The method of claim 9,
    wherein said area reduction comprises reducing an area of said candidate cells by at least one of resizing a cell, recomposing a group of cells into a smaller configuration with a similar function, and moving cells out of said candidate bin.

13. A design tool for designing an integrated circuit chip, comprising:
    a divider which divides a chip area of a design into a plurality of bins by overlaying a grid on the chip;
    an identifier for identifying a candidate bin in the plurality of bins, the candidate bin including a bin having a bin density which exceeds a maximum allowable bin density and a bin criticality which exceeds a maximum allowable bin criticality; and
    an area reducer for performing an area reduction in which area is recovered from cells in the candidate bin which are other than timing-critical,
    wherein said area reducer comprises:
        a designating device for designating said cells in said candidate bin which are other than timing-critical, as candidate cells to be considered for area reduction; and
        a computing device for computing a temporary slack threshold for said candidate cells by adding a separation amount to a best slack in said candidate bin,
    wherein said area reducer reduces an area of said candidate cells having a slack which is greater than said temporary slack threshold.

14. A system for designing an electronic circuit, comprising:
    a divider for dividing a chip area of a design into a plurality of bins;
    an identifying device for identifying a candidate bin in said plurality of bins; and
    an area reducer for performing an area reduction on said candidate bin,
    wherein said area reducer comprises:
        a designating device for designating cells in said candidate bin which are other than timing-critical cells, as candidate cells to be considered for area reduction; and
        a computing device for computing a temporary slack threshold for said candidate cells by adding a separation amount to a best slack in said candidate bin,
    wherein said area reducer reduces an area of said candidate cells having a slack which is greater than said temporary slack threshold.

15. The system of claim 14, further comprising:
    a timing optimizer for performing a timing optimization on said design.

16. The system of claim 14, wherein said area reducer reduces an area of said candidate cells by at least one of resizing a cell, recomposing a group of cells into a smaller configuration with a similar function, and moving cells out of said candidate bin.

17. The system of claim 16, further comprising:
    a filter for filtering said plurality of bins such that a determination of whether to perform a next timing optimization on a bin during an iteration is based on an amount of change in said data for said bin generated by a previous timing optimization.

18. A system for designing an electronic circuit, comprising:
    a divider for dividing a chip area of a design into a plurality of bins;
    an identifying device for identifying a candidate bin in said plurality of bins; and
    an area reducer for performing an area reduction on said candidate bin,
    wherein said identifying device comprises:
        an identifier which identifies timing-critical cells in said plurality of bins, said timing-critical cells having an amount of slack which is greater than a predetermined slack threshold;
        a computing device which:
            computes a bin density for said plurality of bins by dividing a sum of cell areas within a bin in said plurality of bins by a total area of said bin;
            computes a critical area ratio for said plurality of bins by dividing a total area of timing-critical cells in said bin by said total area of said bin;
            computes a slack score for said plurality of bins by subtracting a worst slack in said bin by a slack threshold; and
            computes a bin criticality for said plurality of bins by multiplying said critical area ratio by said slack score; and
        a normalizer which normalizes bin criticalities for said plurality of bins by subtracting a smallest of said bin criticalities from a greatest of said bin criticalities to determine a range and dividing said range by N intervals,
    wherein if said bin density and said normalized bin criticality exceed predetermined thresholds, said identifier identifies said bin as a candidate bin.

* * * * *